United States Patent
Tsai

(10) Patent No.: US 7,560,818 B2
(45) Date of Patent: Jul. 14, 2009

(54) STACKED STRUCTURE OF CHIPS AND WATER STRUCTURE FOR MAKING THE SAME

(75) Inventor: Yu-Pin Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/878,456

(22) Filed: Jul. 24, 2007

(65) Prior Publication Data
US 2008/0048323 A1 Feb. 28, 2008

(30) Foreign Application Priority Data
Aug. 22, 2006 (TW) .............................. 95130771 A

(51) Int. Cl.
  H01L 23/48 (2006.01)
  H01L 23/52 (2006.01)
(52) U.S. Cl. .................. 257/777; 257/686; 257/738
(58) Field of Classification Search .................. 257/685, 257/686, 690, 692, 723, 737, 738, 777, 786, 257/E25.013, E25.021, E25.027
See application file for complete search history.

(56) References Cited

U.S. PATENT DOCUMENTS

| 6,765,299 | B2 * | 7/2004 | Takahashi et al. ............ 257/777 |
| 2005/0001329 | A1 * | 1/2005 | Matsuki et al. .............. 257/777 |

\* cited by examiner

*Primary Examiner*—Hung Vu
(74) *Attorney, Agent, or Firm*—Rabin & Berdo, PC

(57) ABSTRACT

A stacked structure of chips including a first chip, a second chip, an insulation layer and a first conductive element is provided. The second chip is attached to the first chip, and the back surface of the second chip faces an active surface of the first chip. The second chip includes a first contact disposed on an active surface of the second chip. The insulation layer disposed on the active surface of the first chip encapsulates the second chip. The first conductive element is formed in the insulation layer for electrically connecting one end of the first conductive element to the first contact and the other end of the first conductive element exposed outside the insulation layer. A wafer structure for making the stacked structure of chips is also provided. The stacked structure of chips has no circuit carrier, hence reducing the thickness of the stacked structure.

7 Claims, 17 Drawing Sheets

ําSTACKED STRUCTURE OF CHIPS AND WAFER STRUCTURE FOR MAKING THE SAME

This application claims the benefit of Taiwan application Serial No. 095130771, filed Aug. 22, 2006, the subject matter of which is incorporated herein by reference.

BACKGROUND OF THE INVENTION

1. Field of the Invention

The invention relates in general to a chip package structure and a wafer structure for manufacturing the chip package structure, and more particularly to a stacked structure of chips, and a wafer structure for manufacturing the stacked structure of chips.

2. Description of the Related Art

Living in the age of information, users are in pursuit of high-speed, high-quality and multi-functional electronic products. In terms of the appearances of electronic products, the design is directed towards the trends of light-weight, slimness and compactness. To achieve the above objects, many manufacturers introduce the concept of systematization in circuit design for integrating several functions into one single chip such that the required number of chips in an electronic product is reduced. In order to co-operate with the trends of light-weight, slimness and compactness in the design of appearances, many new concepts in package technology are developed. Examples of the new concepts in package design include multi-chip module (MCM) package design, chip scale package (CSP) package design, and stacked structure of chips package design.

FIG. 1 is a cross-sectional view of a conventional stacked structure of chips. Referring to FIG. 1, the conventional stacked structure of chips 100 includes a plurality of stacked chip packages 200a and 200b and a plurality of solder balls 250, wherein the chip packages 200a attached to the chip package 200b are fixed on the chip package 200b by many solder balls 250, and are electrically connected to the chip package 200b via the solder balls 250. Each of the chip packages 200a and 200b includes a package carrier 210, a chip 220, a plurality of bumps 230 and an underfill 240. The chip 220 and the bumps 230 are disposed on the package carrier 210, and the chip 220 is electrically connected to the package carrier 210 via the bumps 230. The underfill 240 is disposed between the chip 220 and the package carrier 210 for wrapping the bumps 230 and mitigating the thermal stress between the chip 220 and the package carrier 210.

The package carrier 210 has a plurality of conductive elements 212 and a plurality of solder pads 214, wherein the conductive elements 212 respectively pass through the package carrier 210, and the solder pads 214 are respectively disposed on the conductive elements 212. Besides, the solder balls 250 are respectively disposed between the solder pads 214 of the chip package 200a and the solder pads 214 of the chip package 200b. Thus, the chip packages 200a and 200b are electrically connected together via the solder balls 250.

As both the package carriers 210 and chip 220 have a certain thickness and both the bumps 230 and the solder balls 250 have a certain height, the chip package 200a and 200b will have a certain thickness which is hard to be reduced. When a plurality of chip packages (200a, 200b. . . ) are stacked to form a stacked structure of chips 100, the thickness of the stacked structure of chips 100 will increase sharply and become unfavorable in terms of design. Therefore, under the restrictions of maintaining the volume and the thickness at a fixed level, the package integration of the stacked structure of chips 100 is hard to improve.

SUMMARY OF THE INVENTION

According to an aspect of the present invention, a thickness-reduced stacked structure of chips is provided.

According to another aspect of present invention, a wafer structure for making a thickness-reduced stacked structure of chips is provided.

According to the above aspect or other aspect of the present invention, a stacked structure of chips is provided. The stacked structure of chips includes a first chip, a second chip, an insulation layer and a first conductive element. The second chip is attached to the first chip, and the back surface of the second chip faces an active surface of the first chip. The second chip includes a first contact disposed on an active surface of the second chip. The insulation layer is disposed on the active surface of the first chip, and the second chip is encapsulated in the insulation layer. The first conductive element is formed in the insulation layer for electrically connecting one end of the first conductive element to the first contact and the other end of the first conductive element exposed outside the insulation layer.

According to an embodiment of the invention, the active surface of the second chip of the stacked structure of chips of the invention has a chip carrying area and the first contact is disposed outside the chip carrying area.

According to an embodiment of the invention, the stacked structure of chips of the invention further includes a first solder ball disposed on the other end of the first conductive element.

According to an embodiment of the invention, the stacked structure of chips of the invention further includes a re-distributed layer (RDL) disposed on the insulation layer and electrically to the first conductive element.

According to an embodiment of the invention, the stacked structure of chips of the invention further includes a second conductive element, and the first chip includes a second contact and is disposed on an active surface of the first chip and outside the coverage of the second chip. The second chip includes a third contact and a fourth contact, wherein the second contact and the third contact are electrically connected to the fourth contact. An active surface of the second chip may have a chip carrying area, and if the active surface of the second chip has a chip carrying area, then the first contact, the third contact and the fourth contact are disposed outside the chip carrying area. The second conductive element is formed in the insulation layer for electrically connecting one end of the second conductive element to the third contact and the other end of the second conductive element exposed outside the insulation layer. The stacked structure of chips may include a wire for electrically connecting the second contact to the fourth contact. The stacked structure of chips may include a trace disposed on an active surface of the second chip for electrically connecting the fourth contact to the third contact. The stacked structure of chips may include a second solder ball disposed on the other end of the second conductive element. The stacked structure of chips may include a re-distributed layer disposed on the insulation layer and electrically connected to the first conductive element and the second conductive element.

According to another aspect of the present invention, a wafer structure is provided. The wafer structure includes a semiconductor substrate, a second chip, an insulation layer and a first conductive element. The semiconductor substrate includes a first chip. The second chip is attached to the first chip, and a back surface of the second chip faces an active surface of the first chip. The second chip includes a first contact disposed on an active surface of the second chip. The insulation layer is disposed on the active surface of the first chip, and the second chip is encapsulated in the insulation layer. The first conductive element is formed in the insulation layer for electrically connecting one end of the first conductive element to the first contact and the other end of the first conductive element exposed outside the insulation layer.

According to an embodiment of the invention, the active surface of the second chip of the wafer structure of the invention has a chip carrying area and the first contact is disposed outside the chip carrying area.

According to an embodiment of the invention, the wafer structure of the invention further includes a first solder ball disposed on the other end of the first conductive element.

According to an embodiment of the invention, the wafer structure of the invention further includes a re-distributed layer disposed on the insulation layer and electrically connected to the first conductive element.

According to an embodiment of the invention, the wafer structure of the invention further includes a second conductive element, and the first chip includes a second contact disposed on an active surface of the first chip and outside the coverage of the second chip. The second chip includes a third contact and a fourth contact, wherein the second contact and the third contact are electrically connected to the fourth contact. The active surface of the second chip may have a chip carrying area, and if the active surface of the second chip has a chip carrying area, then the first contact, the third contact and the fourth contact are disposed outside the chip carrying area. The second conductive element is formed in the insulation layer for electrically connecting one end of the second conductive element to the third contact and the other end of the second conductive element exposed outside the insulation layer. The stacked structure of chips may include a wire for electrically connecting the second contact to the fourth contact. The stacked structure of chips may include a trace disposed on an active surface of the second chip for electrically connecting the fourth contact to the third contact. The stacked structure of chips may include a second solder ball disposed on the other end of the second conductive element. The stacked structure of chips may include a re-distributed layer disposed on the insulation layer and electrically connected to the first conductive element and the second conductive element.

According to the invention, a plurality of chips are integrated into one single package, that is, a stacked structure of chips, such that the single package has multiple functions. Besides, the stacked structure of chips has no circuit carrier, hence reducing the thickness, the materials and the costs of the stacked structure of chips.

The invention will become apparent from the following detailed description of the preferred but non-limiting embodiments. The following description is made with reference to the accompanying drawings.

DETAILED DESCRIPTION OF THE INVENTION

Figure 1:
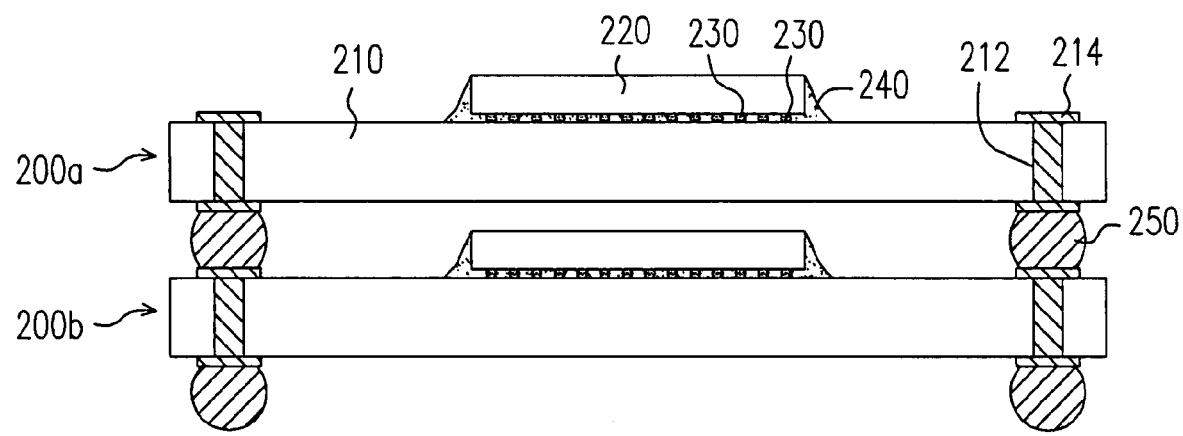
FIG. 1 (Prior art) is a cross-sectional view of a conventional stacked structure of chips.

FIG. 2A~FIG. 2F are cross-sectional views of a manufacturing process of a wafer structure according to an embodiment of the invention. FIG. 3 is a top view of FIG. 2A. Referring to both FIG. 2A and FIG. 3. At first, a semiconductor substrate 300 including at least one first chip 310 is provided. The boundary 302 between two neighboring first chips 310 is denoted by a dotted line in FIG. 3 and FIG. 2A. The active surface 314 of the first chip 310 having one or a plurality of second contacts 312 has a chip carrying area 314a. The second contact 312 is disposed outside the chip carrying area 314a.

Figure 2A:
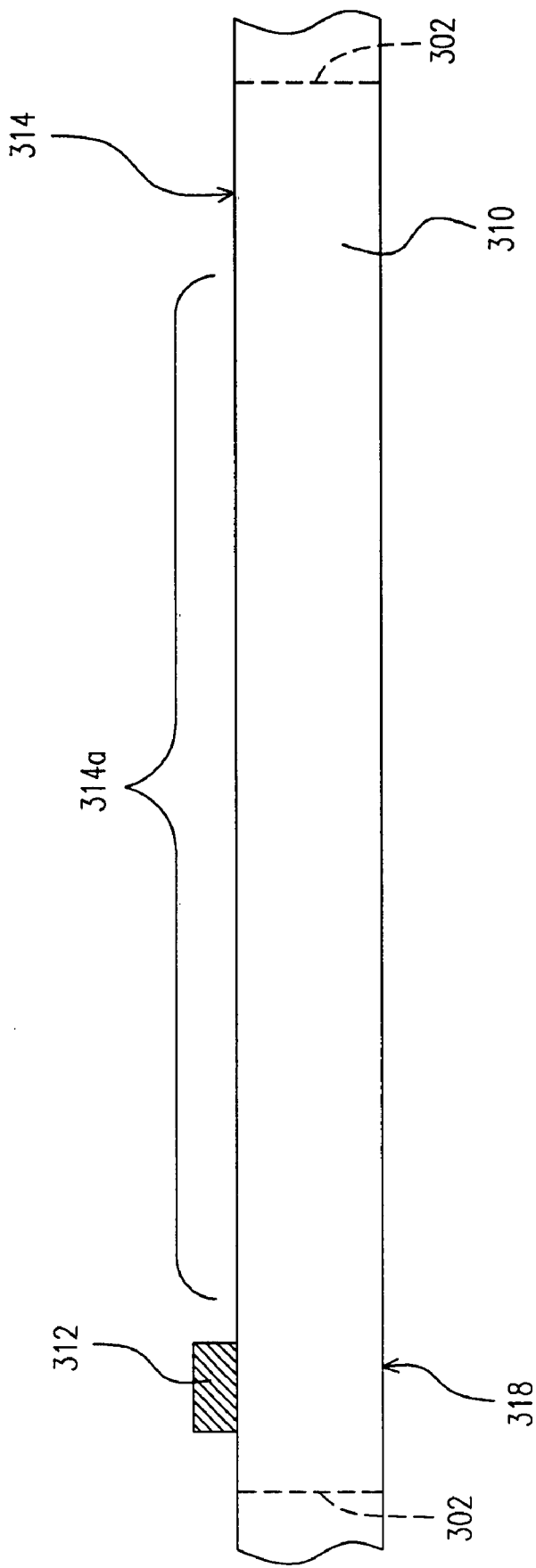
FIGS. 2A~2F are cross-sectional views of a manufacturing process of a wafer structure according to an embodiment of the invention.
Figure 2B:
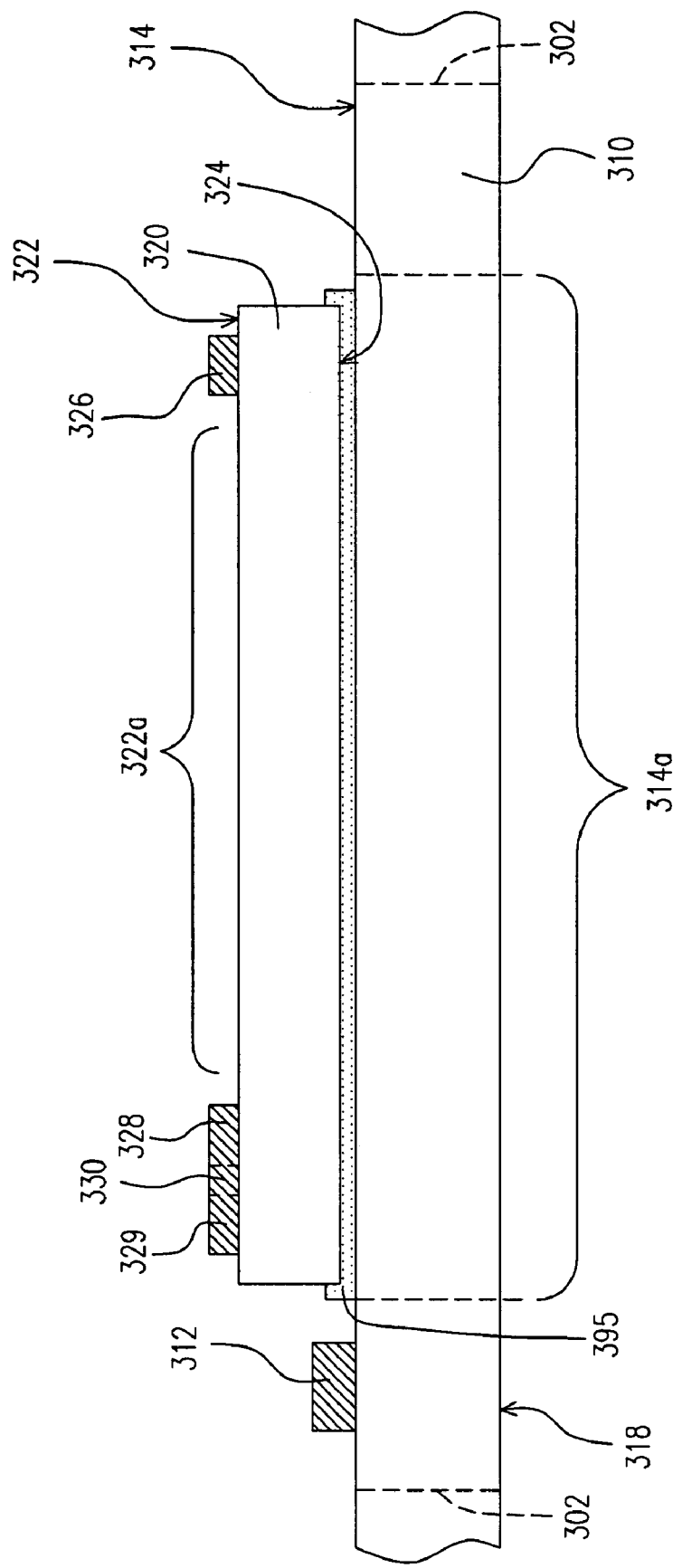
Figure 3:
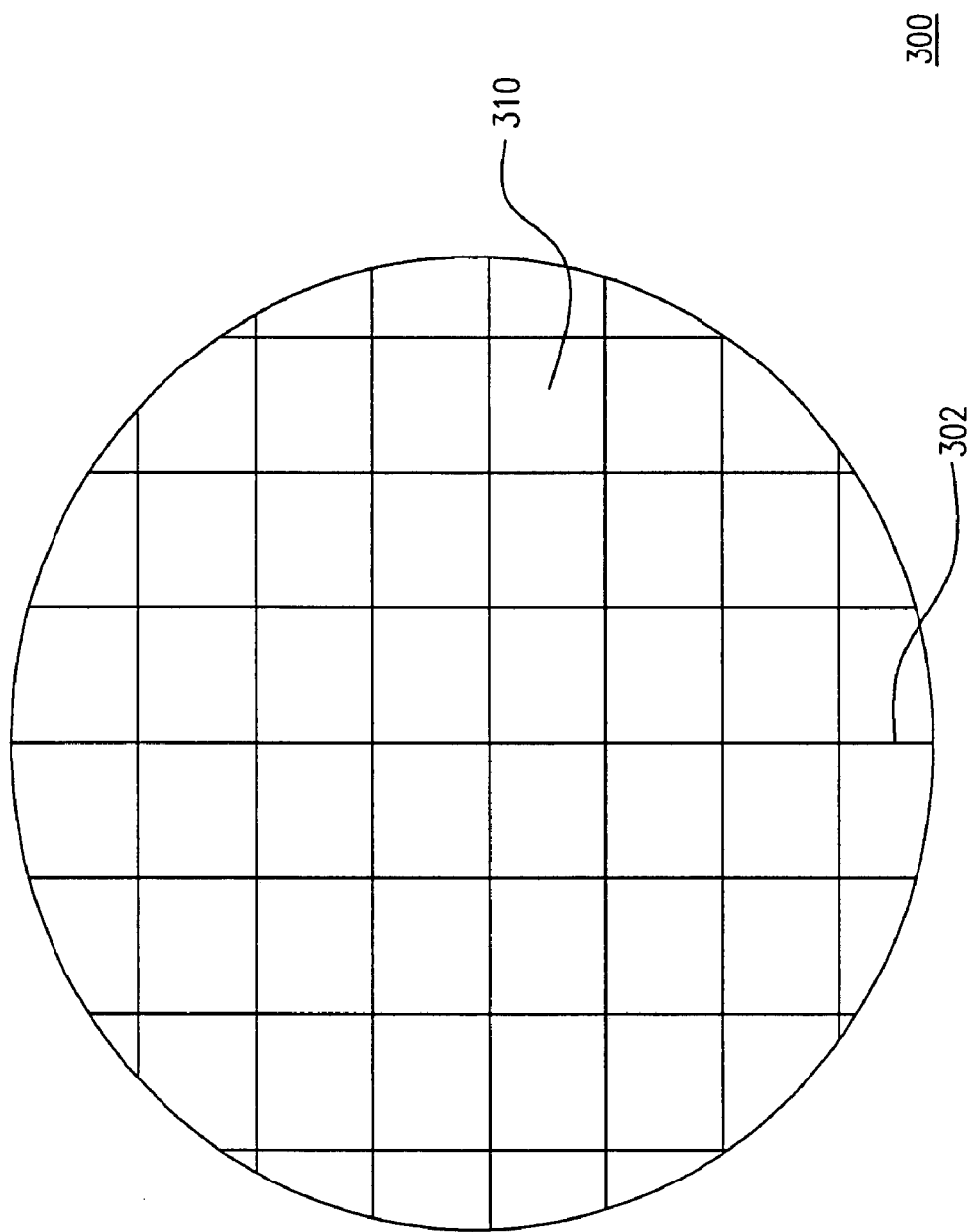
FIG. 3 is a top view of FIG. 2A.

Referring to FIG. 2B. Next, a second chip 320 having an active surface 322 and a back surface of 324 is provided. Then, the back surface 324 is arranged to face the active surface of 314 of the first chip 310, and the second chip 320 is disposed within the chip carrying area 314a. The back surface 324 and the active surface 314 are adhered via an adhesive 395. The active surface of 322 of the second chip 320 has one or a plurality of first contacts 326 disposed thereon. Besides, the active surface 322 has one or a plurality of third contacts 328 and one or a plurality of fourth contacts 329 disposed thereon, wherein the third contact 328 is electrically connected to the fourth contact 329 via a trace 330 disposed on the active surface 322. Furthermore, the active surface 322 may have a chip carrying area 322a, the first contact 326, the third contact 328 and the fourth contact 329 are disposed outside the chip carrying area 322a,.

Figure 2C:
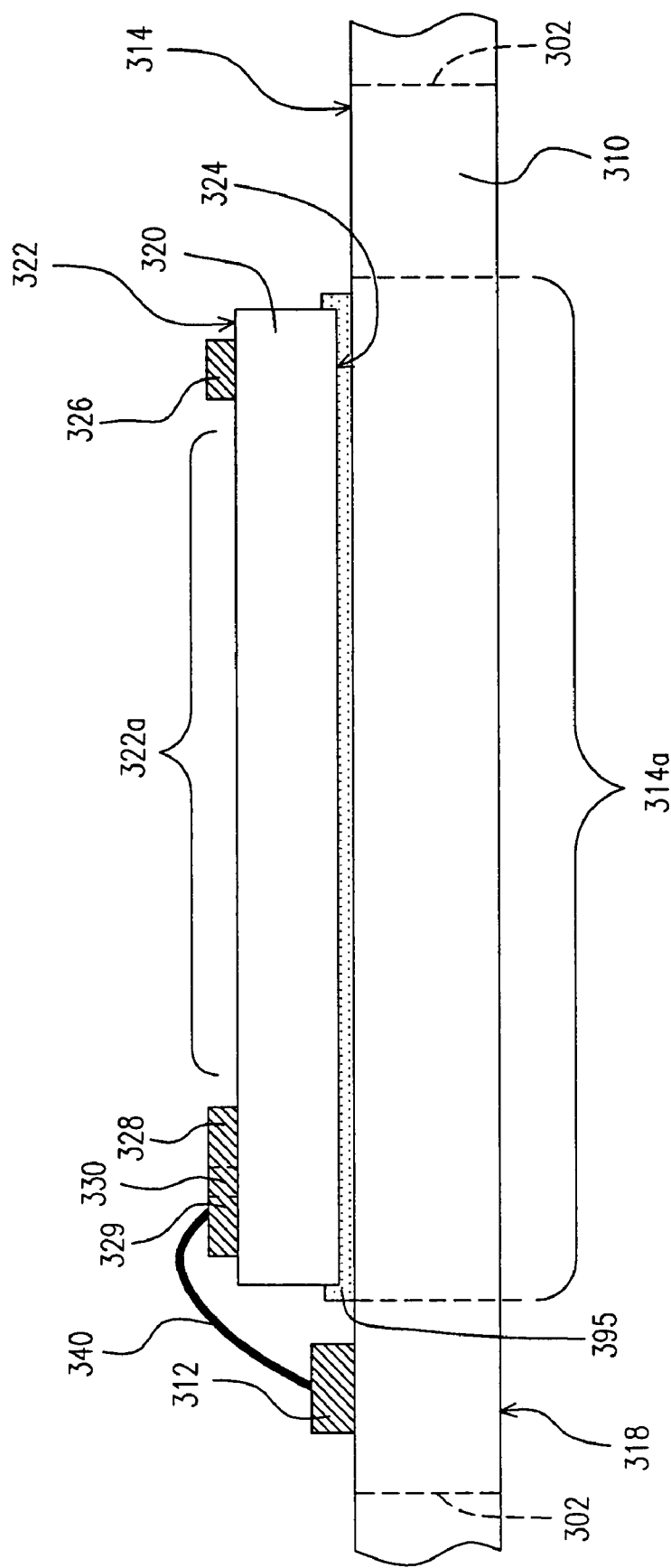
Figure 4:
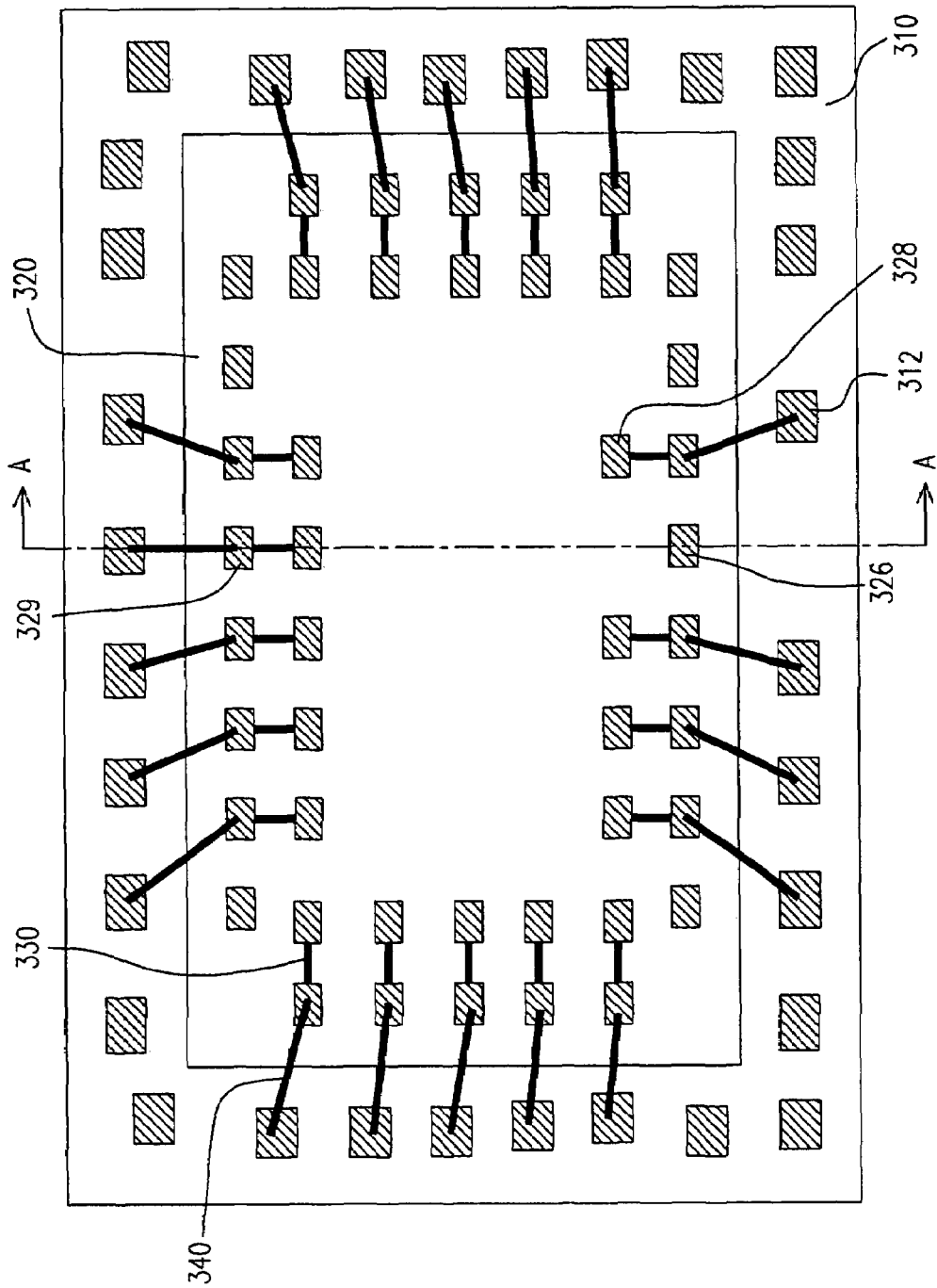
FIG. 4 is a top view of the structure illustrated in FIG. 2C of an embodiment of the invention.

FIG. 4 is a top view of the structure illustrated in FIG. 2C of an embodiment of the invention. FIG. 2C is a cross-sectional view along the cross-sectional line A-A of FIG. 4. Referring to FIG. 2C and FIG. 4. Then, a wire 340 is used for electrically connecting the second contact 312 to the fourth contact 329, such that the second contact 312 is electrically connected to the third contact 328 via the wire 340, the fourth contact 329 and the trace 330. FIG. 4 only illustrates the quantities and positions of the first contact 326, the second contact 312, the third contact 328, the fourth contact 329, the wire 340 and the trace 330 in an embodiment of the invention and is not for limiting the invention. The quantities and positions of the elements used in the invention can be adjusted according to actual needs.

Figure 2D:
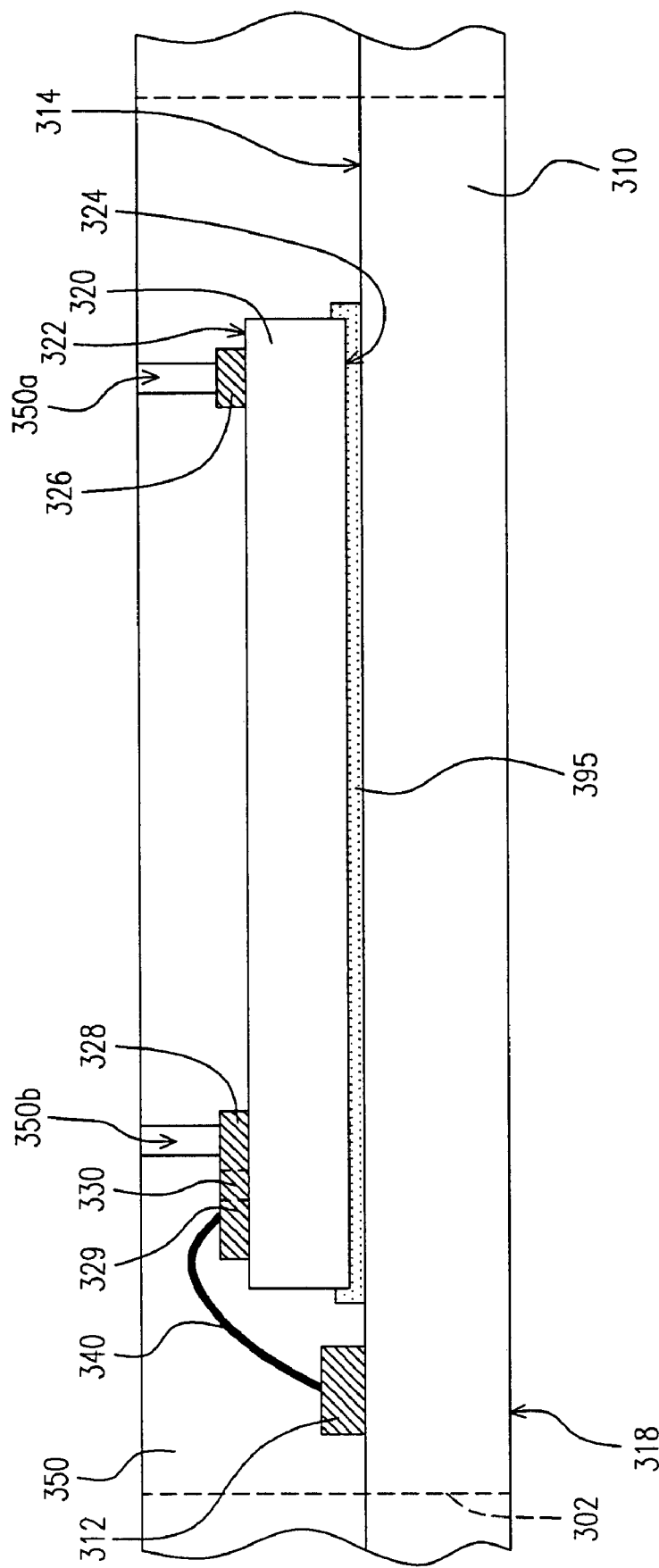

Referring to FIG. 2D. Next, an insulation layer 350 is formed on the active surface 314 of the first chip 310, wherein the second chip 320 is encapsulated in the insulation layer. The insulation layer 350 is made of epoxy or other insulating materials. Besides, the insulation layer 350 has one or a plurality of first reserved holes 350a for exposing the first contact 326. The insulation layer 350 also has one or a plurality of second reserved holes 350b for exposing the third contact 328.

Figure 2E:
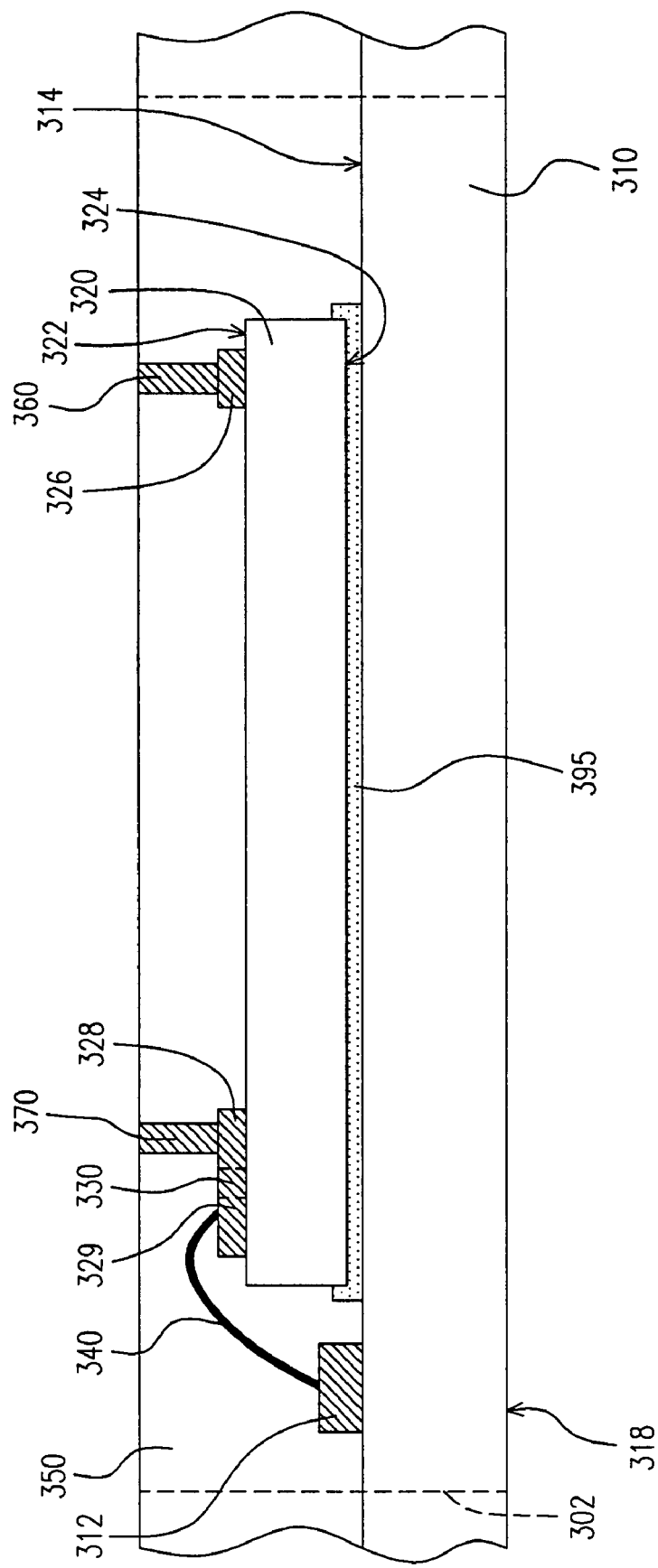

Referring to FIG. 2E. Then, a first conductive element 360 is formed in each of the first reserved holes 350a, wherein one end of the first conductive element 360 is electrically connected to the first contact 326 and the other end of the first conductive element 360 is exposed outside the insulation layer 350. Besides, a second conductive element 370 is formed in each of the second reserved holes 350b, wherein one end of the second conductive element 370 is electrically connected to the third contact 328 and the other end of the second conductive element is exposed outside the insulation layer 350. The ways of forming the first conductive element 360 and the second conductive element 370 include electroplating method.

Figure 2F:
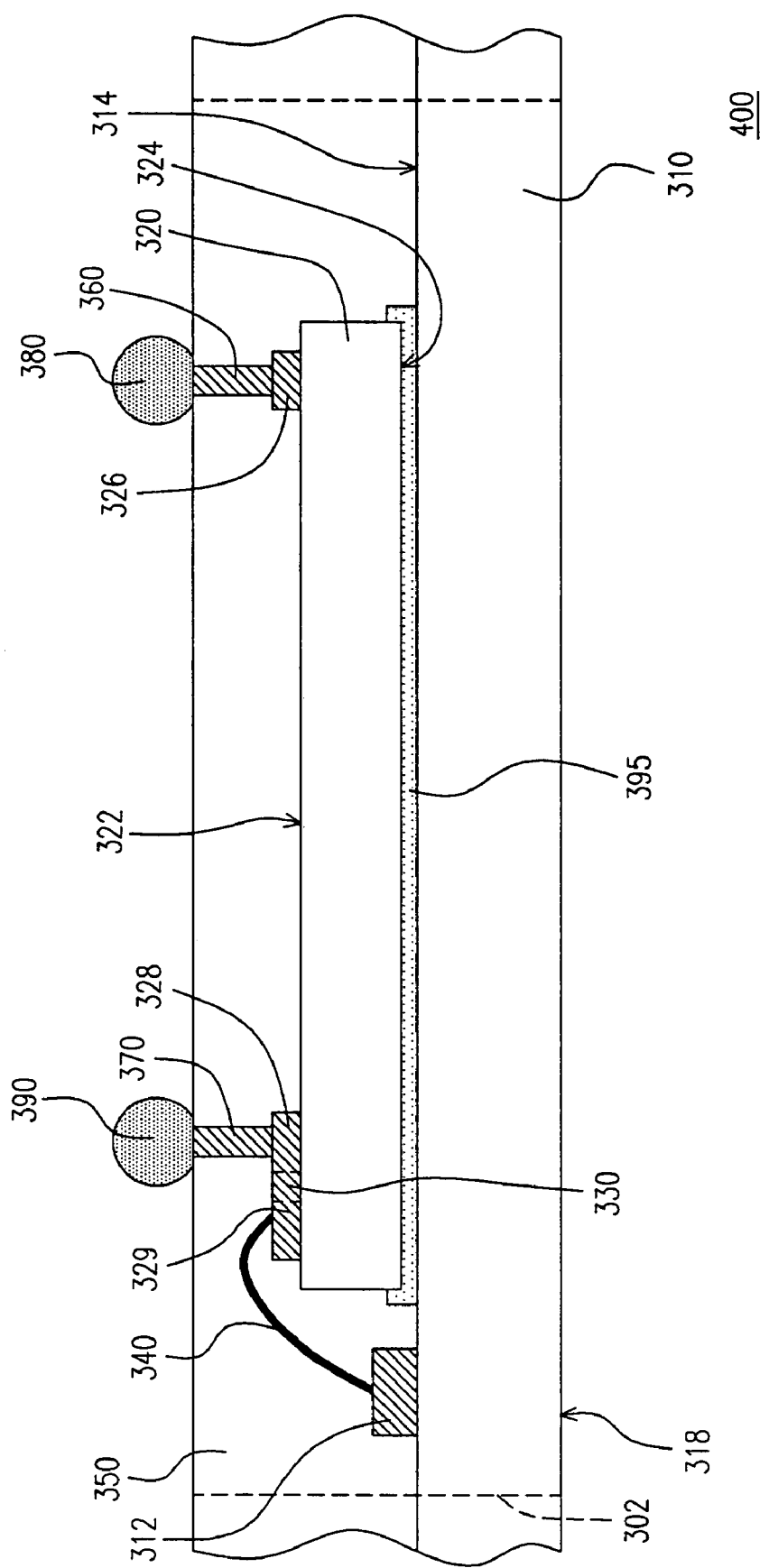

Referring to FIG. 2F. Then, a first solder ball 380 can be formed on the other end of each of the first conductive elements 360. Besides, a second solder ball 390 can also be formed on the other end of each of the second conductive elements 370. The first chip 310 and the second chip 320 are suitable to be electrically connected to an external element via the first solder ball 380 and the second solder ball 390. The first solder ball 380 and the second solder ball 390 are made of solder, lead-free solder or other conductive materials. The manufacturing of the wafer structure 400 of the invention is completed here.

Figure 5:
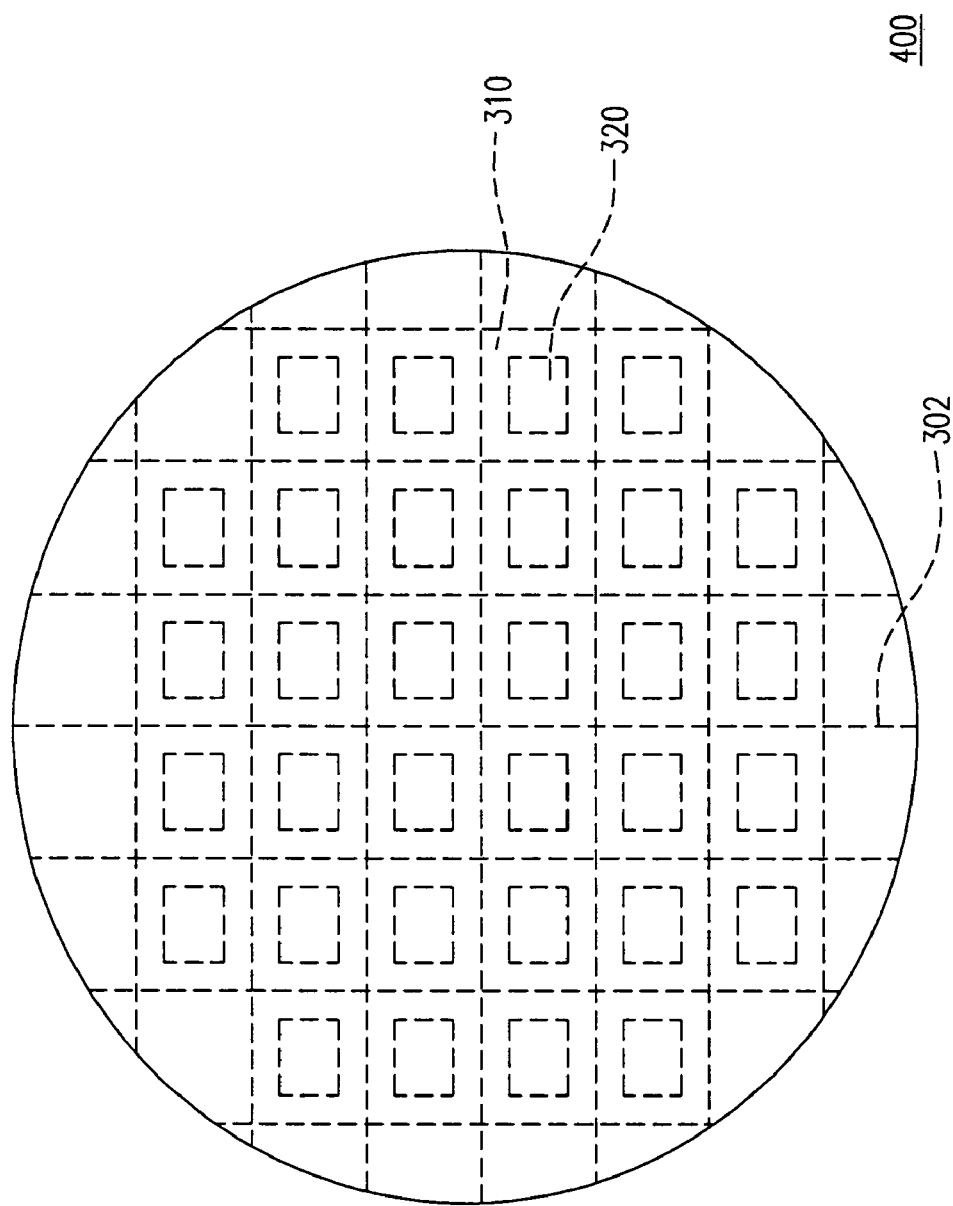
FIG. 5 a top view of a completed wafer structure according to an embodiment of the invention.
Figure 9A:
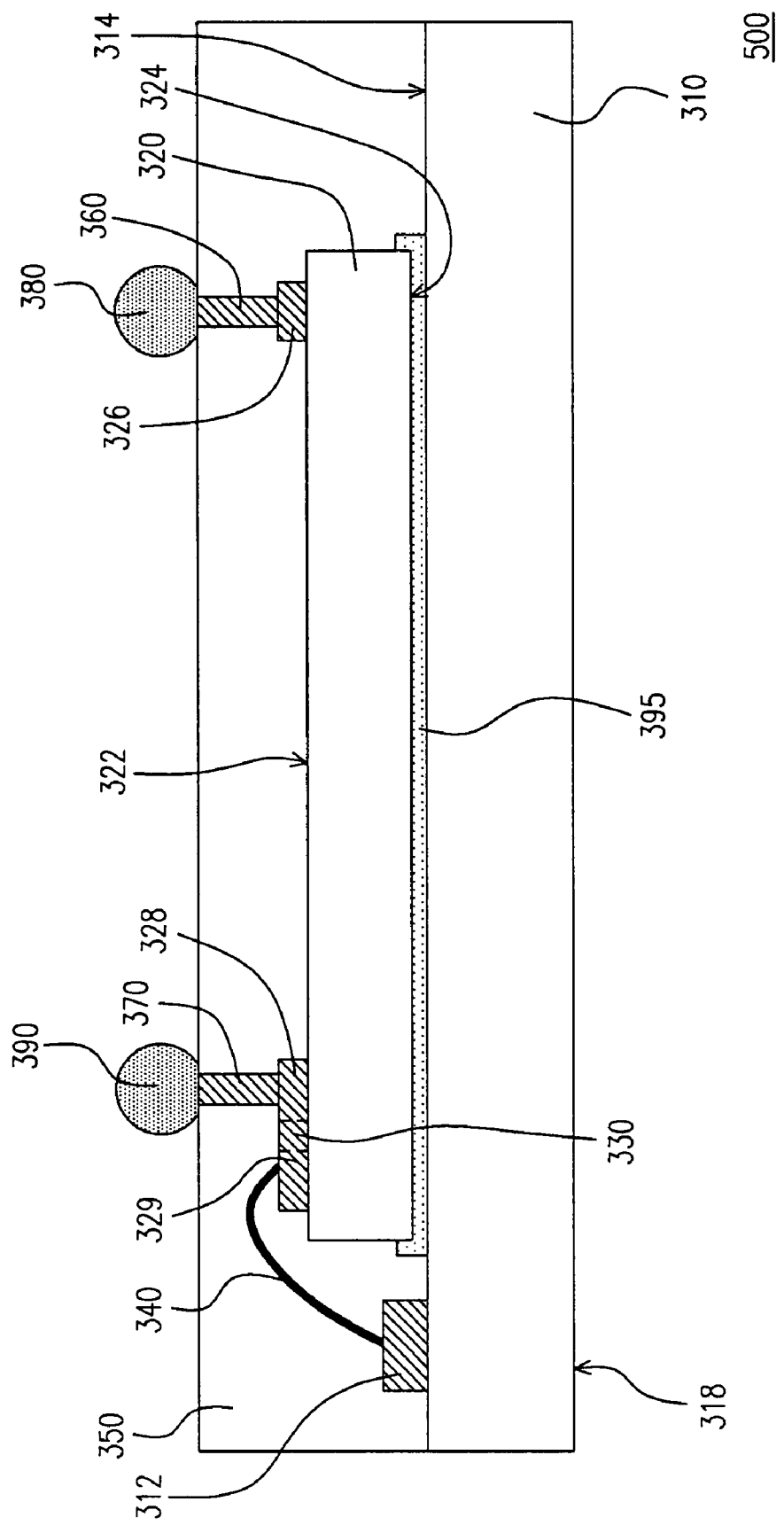
FIG. 9A is a cross-sectional view of a completed stacked structure of chips according to of the invention a embodiment.

FIG. 5 is a top view of a completed wafer structure according to an embodiment of the invention. Referring to FIG. 2F and FIG. 5. The wafer structure 400 is divided into a plurality of stacked structures of chips 500 along the boundary 302 as indicated in FIG. 9A. However, in the invention, the stacked structure of chips 500 is not limited to be formed by dividing the wafer structure 400. In another embodiment of the invention, the semiconductor substrate 300 is divided into a plurality of separate first chips 310 along the wafer cutting line 302 first, and then each first chip 310 is used for forming a stacked structure of chips 500 of FIG. 9A via the steps illustrated in FIG. 2A to FIG. 2F.

Compared with a conventional stacked structure of chips, the stacked structure of chips of the invention 500 has no circuit carrier, hence reducing the thickness, material and cost of the package structure. Besides, the back surface 318 (as indicated in FIG. 9A) of the first chip 310 of the stacked structure of chips 500 is exposed outside the structure, hence improving the heat radiation of the stacked structure of chips 500.

Figure 6:
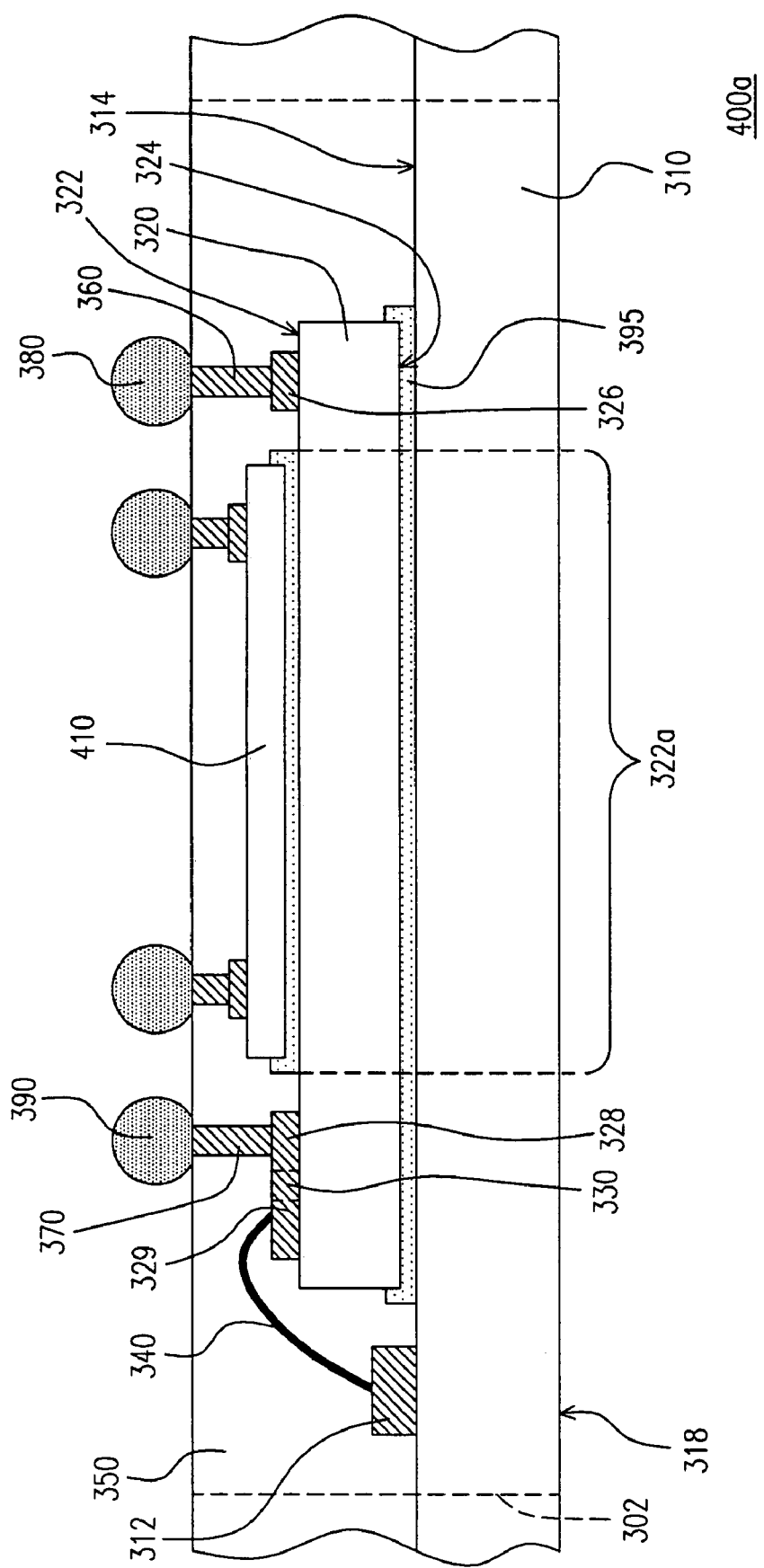
FIG. 6 is a cross-sectional view of a wafer structure stacking a third chip on the second chip according to another embodiment of the invention.
Figure 9B:
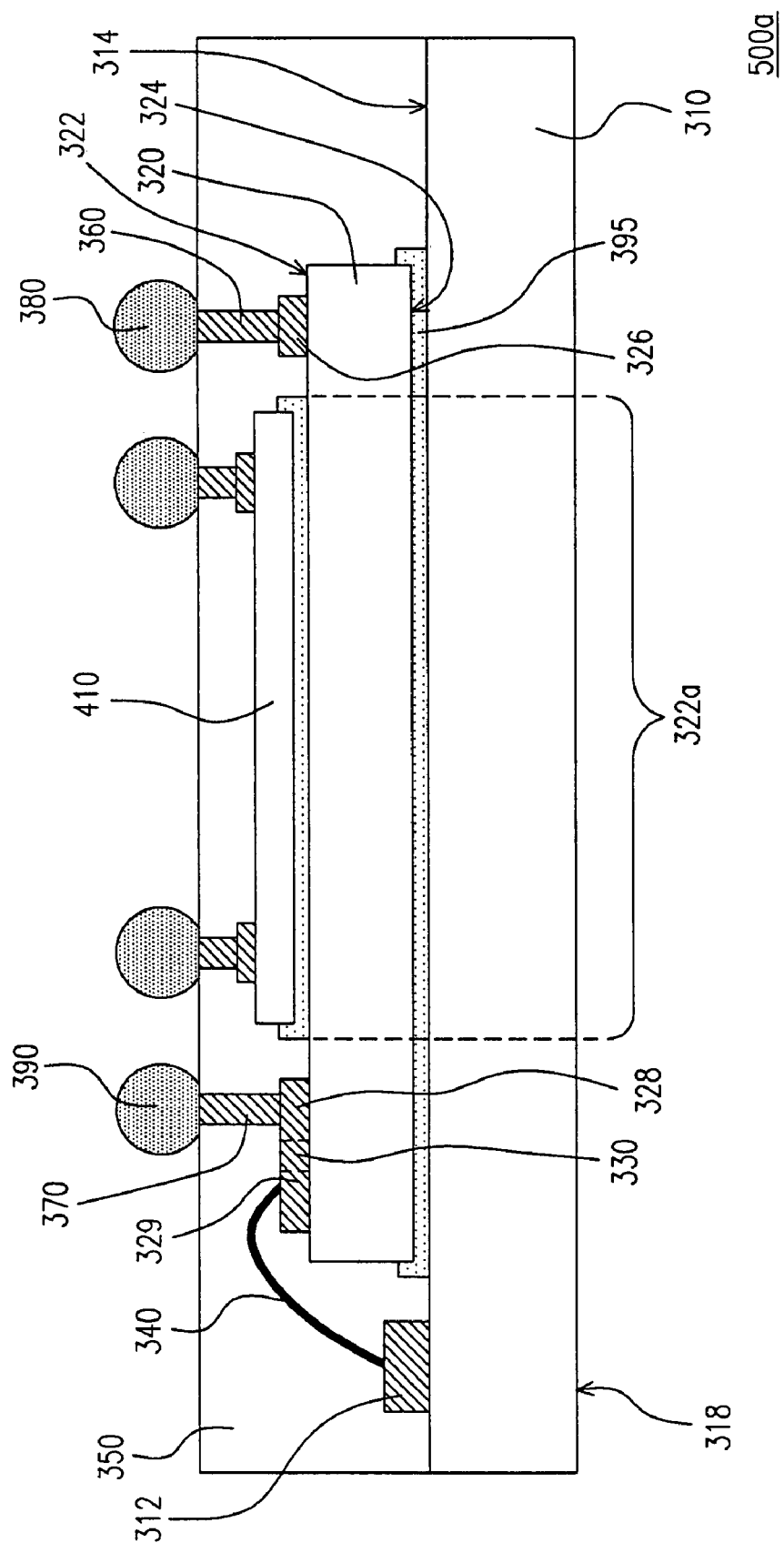
FIG. 9B is a cross-sectional view of a stacked structure of chips stacking a third chip on the second chip according to another embodiment of the invention

FIG. 6 is a cross-sectional view of a wafer structure stacking a third chip on the second chip according to another embodiment of the invention. FIG. 9B is a cross-sectional view of a stacked structure of chips stacking a third chip on the second chip according to another embodiment of the invention. Referring to FIG. 6 and FIG. 9B, the chip carrying area 322a of the second chip 320 of the wafer structure 400a or the stacked structure of chips 500a can have a third chip 410 disposed thereon, such that the stacked structure of chips is able to integrate more chips.

Figure 7:
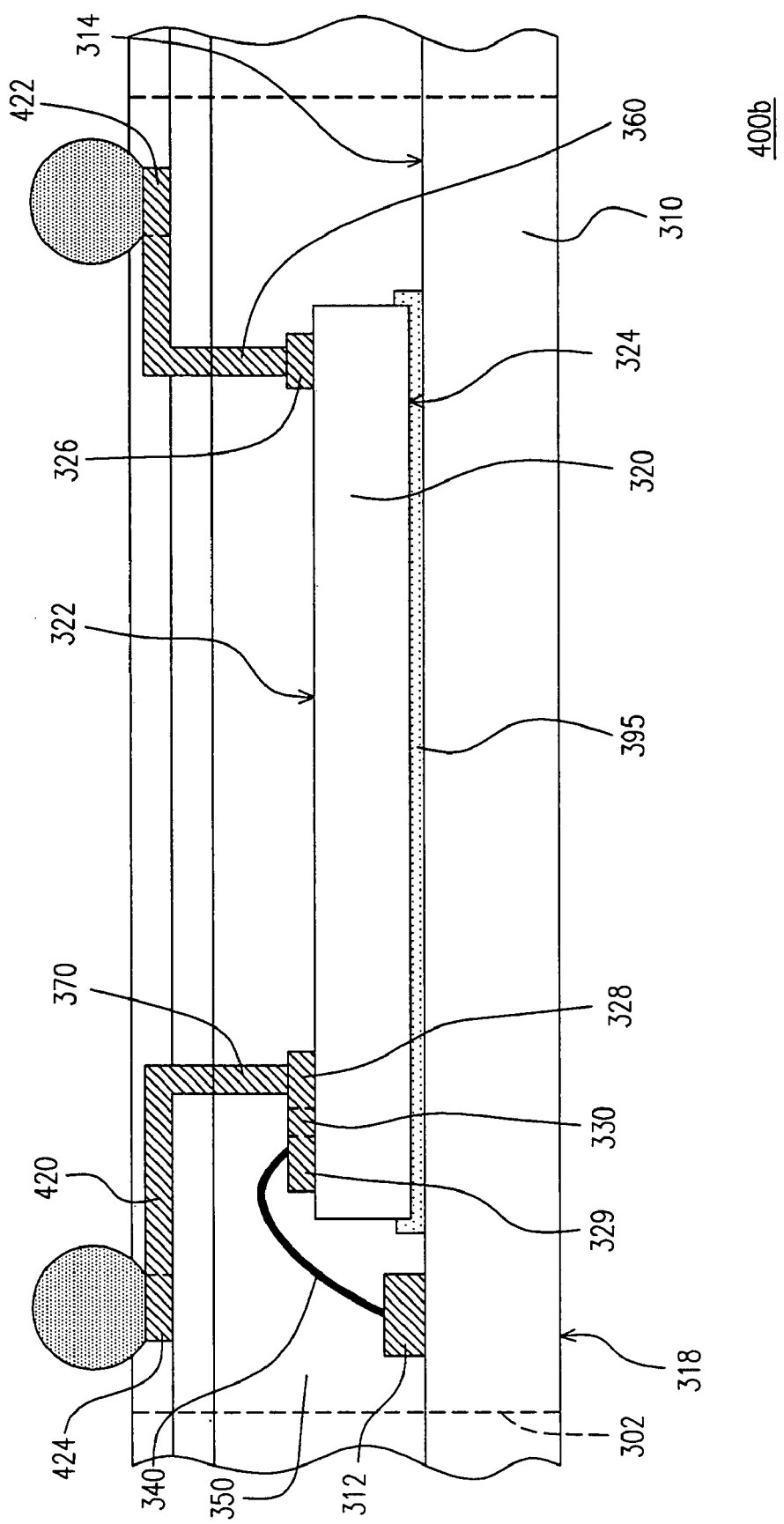
FIG. 7 is a cross-sectional view of a wafer structure according to yet another embodiment of the invention.
Figure 9C:
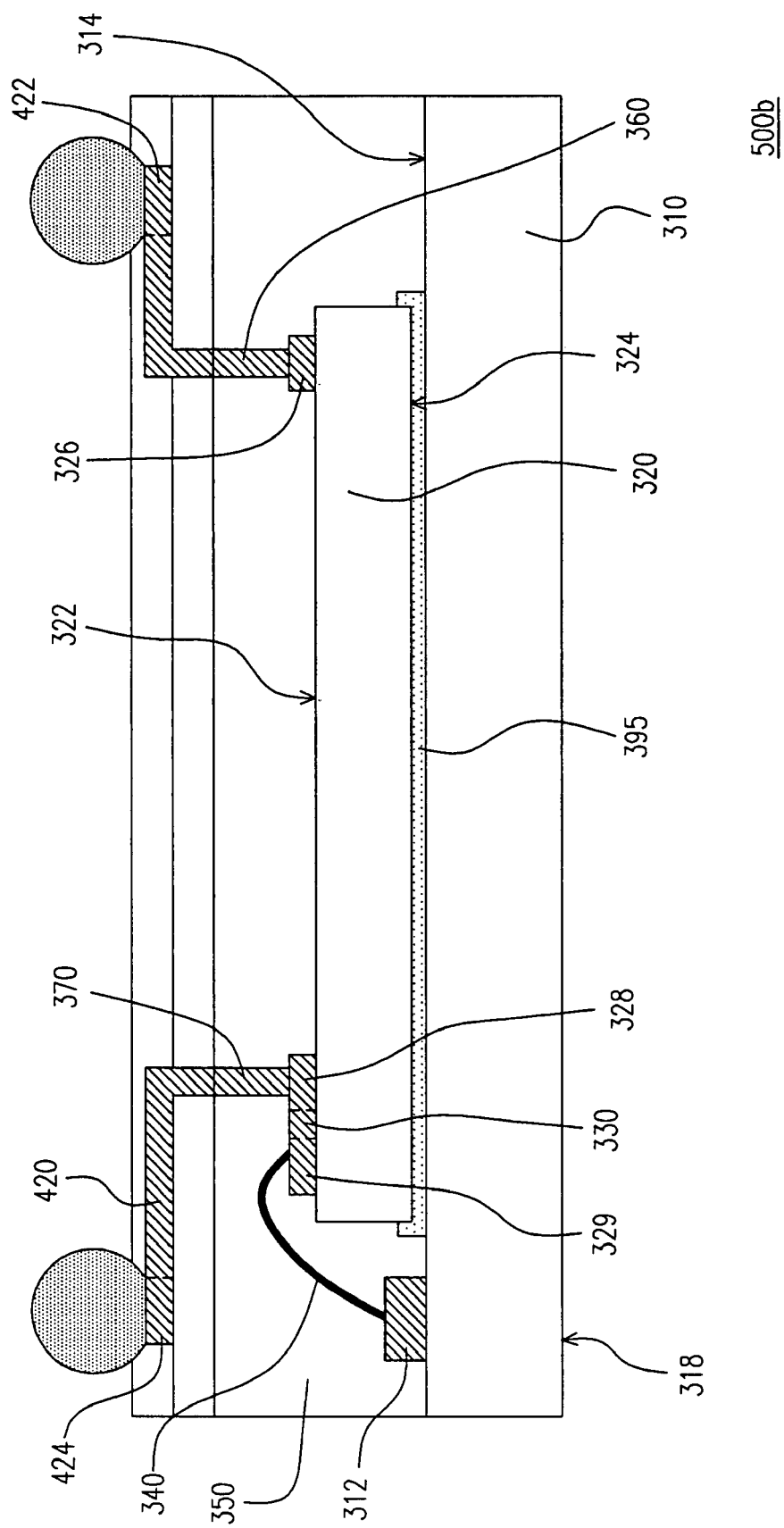
FIG. 9C is a cross-sectional view of a wafer structure according to yet another embodiment of the invention.

FIG. 7 is a cross-sectional view of a wafer structure according to yet another embodiment of the invention. FIG. 9C is a cross-sectional view of a stacked structure of chips according to yet another embodiment of the invention. Referring to FIG. 7 or FIG. 9C, the insulation layer 350 of the wafer structure 400b or the stacked structure of chips 500b can further have a re-distributed layer 420 disposed thereon, wherein the re-distributed layer 420 is electrically connected to the first conductive element 360 and the second conductive element 370. Besides, the re-distributed layer 420 has one or a plurality of fifth contacts 422 and sixth contacts 424 suitable to be electrically connected to an external element. With the disposition of the re-distributed layer 420, the present embodiment of the invention is able to re-arrange the positions of the contacts on the surface of the wafer structure or the stacked structure of chips.

Figure 8:
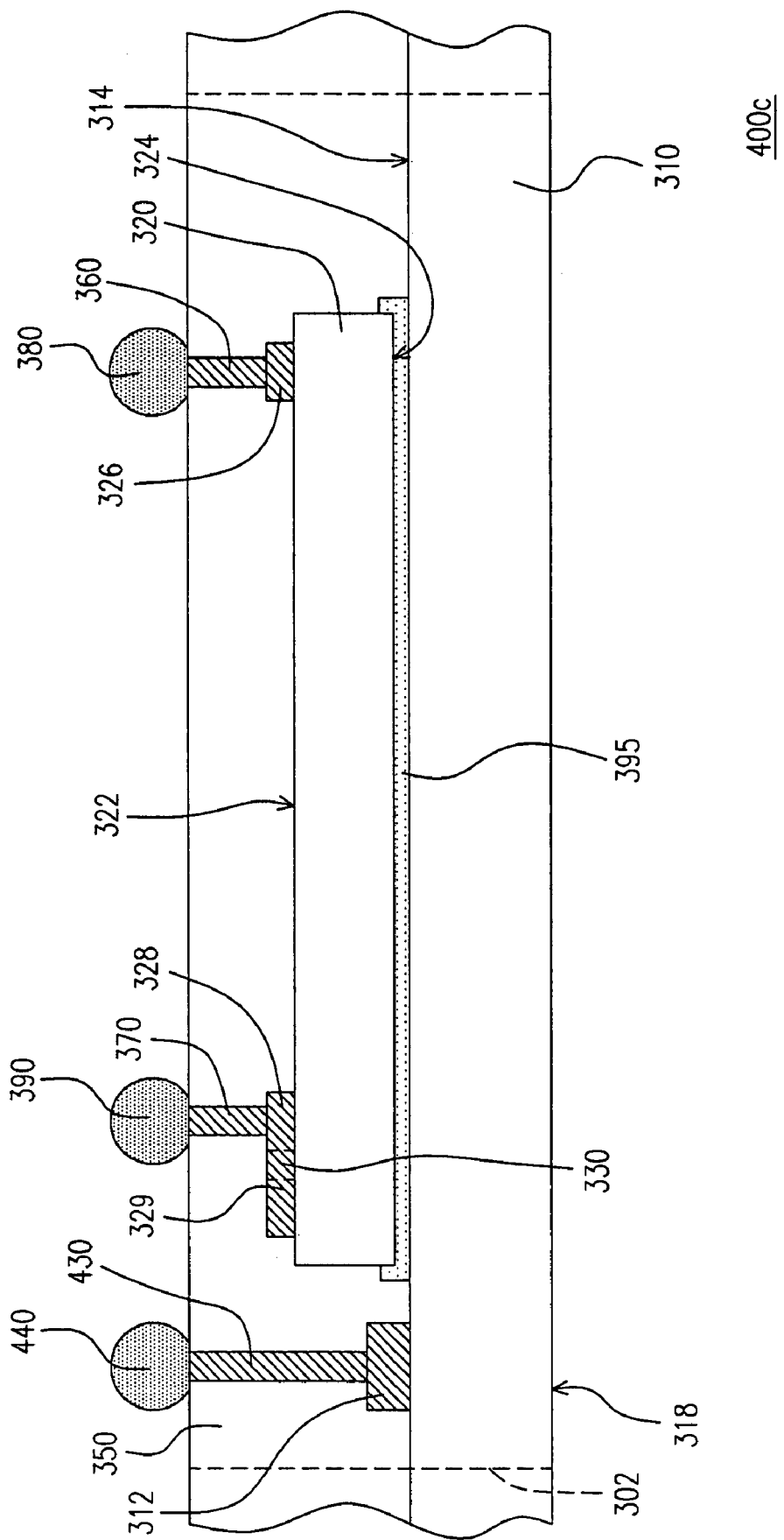
FIG. 8 is a cross-sectional view of a wafer structure according to further another embodiment of the invention.
Figure 9D:
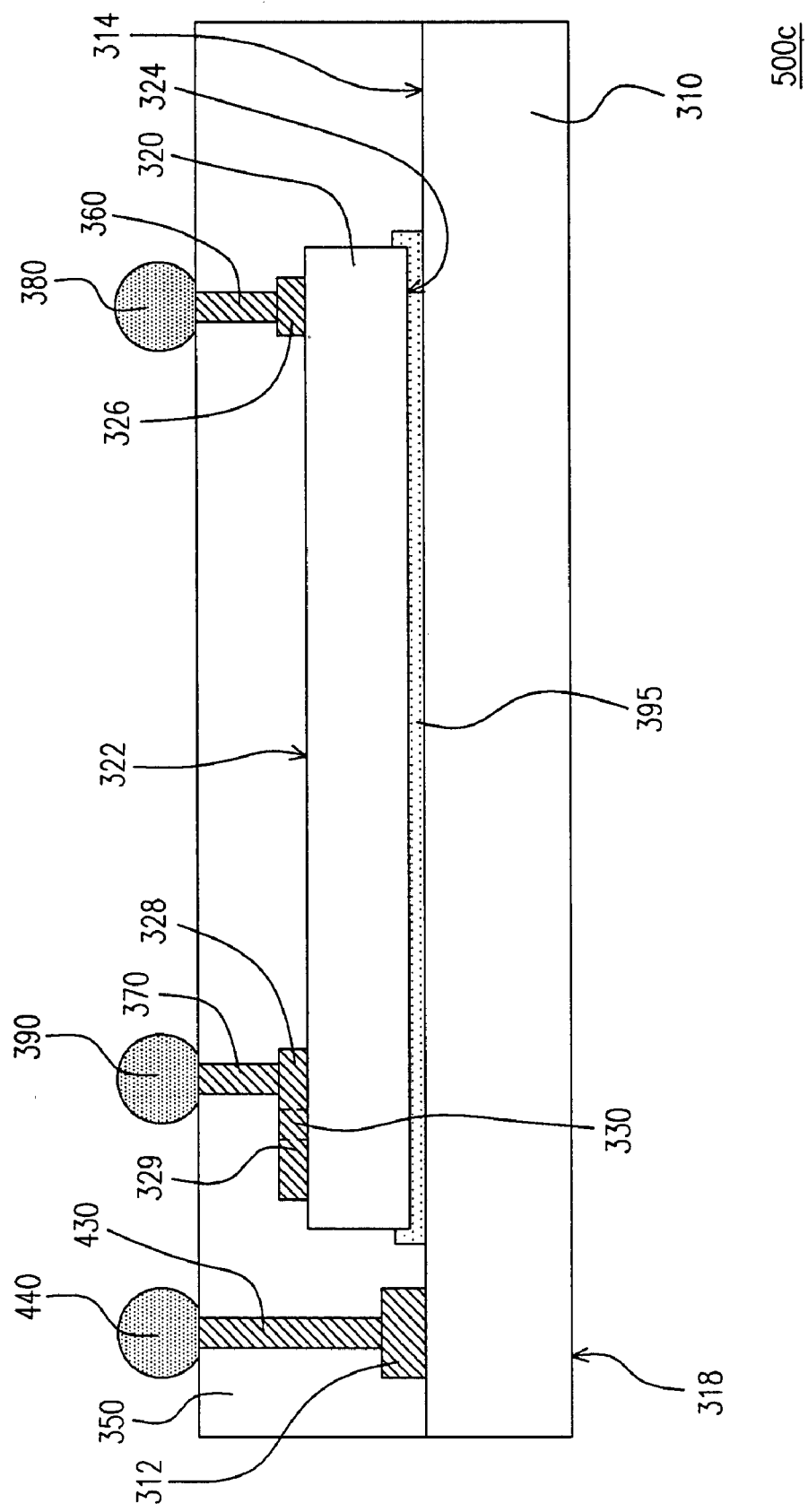
FIG. 9D is a cross-sectional view of a wafer structure according to further another embodiment of the invention.

FIG. 8 is a cross-sectional view of a wafer structure according to further another embodiment of the invention. FIG. 9D is a cross-sectional view of a stacked structure of chips according to further another embodiment of the invention. Referring to FIG. 8 or FIG. 9D, the wafer structure 400c or the stacked structure of chips 500c further includes a third conductive element 430 formed in the insulation layer 350 for electrically connecting one end of the third conductive element 430 to the second contact 312 and the other end of the third conductive element 430 exposed outside the insulation layer 350. In other words, the second contact 312 is suitable to be electrically connected to an external element via the third conductive element 430. Besides, the wafer structure 400c or the stacked structure of chips 500c further includes a third solder ball 440 disposed on the other end of the third conductive element 430 for enabling the third conductive element 430 to be electrically connected to an external element.

According to the above disclosure, the stacked structure of chips of the invention has no circuit carrier, hence reducing the thickness, material and cost of the package structure. Compared with a conventional stacked structure of chips, the back surface of the first chip of the stacked structure of chips is exposed outside the structure, hence improving the heat radiation of the stacked structure of chips.

While the invention has been described by way example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A stacked structure of chips, comprising:
  a first chip;
  a second chip attached to the first chip, wherein the back surface of the second chip faces an active surface of the first chip, and the second chip comprises a first contact disposed on an active surface of the second chip;
  an insulation layer disposed on the active surface of the first chip, wherein the second chip is encapsulated in the insulation layer;
  a first conductive element formed in the insulation layer for electrically connecting one end of the first conductive element to the first contact and the other end of the first conductive element exposed outside the insulation layer; and
  a second conductive element, wherein the first chip comprises a second contact disposed on the active surface of the first chip and outside the coverage of the second chip, the second chip comprises a third contact and a fourth contact, and the second contact and the third contact are electrically connected to the fourth contact, the second conductive element is formed in the insulation layer for electrically connecting one end of the second conductive element to the third contact and the other end of the second conductive element exposed outside the insulation layer.

2. The stacked structure of chips according to claim 1, wherein the active surface of the second chip has a chip carrying area, the first contact, the third contact and the fourth contact are disposed outside the chip carrying area.

3. The stacked structure of chips according to claim 1, further comprising a wire for electrically connecting the second contact to the fourth contact.

4. The stacked structure of chips according to claim 1, further comprising a trace disposed on the active surface of the second chip for electrically connecting the fourth contact to the third contact.

5. The stacked structure of chips according to claim 1, further comprising a second solder ball disposed on the other end of the second conductive element.

6. The stacked structure of chips according to claim 1, further comprising a re-distributed layer disposed on the insulation layer and electrically connected to the first conductive element and the second conductive element.

7. The stacked structure of chips according to claim 1, further comprising a third conductive element, wherein one end of the third conductive element is connected to the second contact and the other end of the third conductive element is exposed outside the insulation layer.

* * * * *